(12) United States Patent
Amano et al.

(10) Patent No.: US 12,133,297 B2
(45) Date of Patent: Oct. 29, 2024

(54) SUBSTRATE PROCESSING APPARATUS

(71) Applicant: Tokyo Electron Limited, Tokyo (JP)

(72) Inventors: Yoshifumi Amano, Koshi (JP); Akira Fujita, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 948 days.

(21) Appl. No.: 16/842,848

(22) Filed: Apr. 8, 2020

(65) Prior Publication Data

US 2020/0337118 A1 Oct. 22, 2020

(30) Foreign Application Priority Data

Apr. 16, 2019 (JP) ................. 2019-077567

(51) Int. Cl.
*H05B 1/02* (2006.01)
*H01L 21/67* (2006.01)

(52) U.S. Cl.
CPC ....... *H05B 1/0247* (2013.01); *H01L 21/6715* (2013.01); *H05B 1/0233* (2013.01)

(58) Field of Classification Search
CPC .......... G06F 21/31; G06F 21/6218; G06F 2221/2141; H04L 63/083; H04L 63/101; H04L 63/104; H01L 21/67109; H01L 21/6715; H01L 21/68785; H01L 21/304; H01L 21/306; H05B 1/0233; H05B 1/0247
(Continued)

(56) References Cited

U.S. PATENT DOCUMENTS 7,838,800 B2 * 11/2010 Tsukamoto ............. F27D 19/00
219/390
8,075,731 B2 * 12/2011 Miya ................. H01L 21/67051
156/345.33
(Continued)

FOREIGN PATENT DOCUMENTS

JP 2906001 B2 6/1999
JP 2008-130893 A 6/2008
(Continued)

OTHER PUBLICATIONS

Translation JP2018/195686 (Year: 2022).*
(Continued)

*Primary Examiner* — Nathaniel E Wiehe
*Assistant Examiner* — Frederick F Calvetti
(74) *Attorney, Agent, or Firm* — Pearne & Gordon LLP (57) ABSTRACT

A substrate processing apparatus includes a holder and a heating device. The holder is configured to hold a central portion of a bottom surface of a substrate to be rotated. The heating device is configured to supply a heated fluid to the bottom surface of the substrate. The heating device includes multiple fins, a heat source, a fluid introduction unit and a fluid discharge unit. The multiple fins are arranged along a circumferential direction of the substrate to be located under the substrate at an outer side than the holder. The heat source is configured to heat the multiple fins. The fluid introduction unit is configured to introduce the fluid to the multiple fins. The fluid discharge unit is configured to discharge the fluid, which is heated while passing through the multiple fins, to the bottom surface of the substrate.

19 Claims, 7 Drawing Sheets

(58) Field of Classification Search
USPC ...................................................... 219/444.1
See application file for complete search history.

(56) References Cited

U.S. PATENT DOCUMENTS

| | | | | |
|---|---|---|---|---|
| 8,744,250 | B2* | 6/2014 | Koelmel | H01L 21/68735 |
| | | | | 118/728 |
| 8,828,183 | B2* | 9/2014 | Namba | H01L 21/02087 |
| | | | | 156/345.55 |
| 9,859,136 | B2* | 1/2018 | Namba | H01L 21/6838 |
| 2010/0319615 | A1* | 12/2010 | Higashijima | H01L 21/6708 |
| | | | | 118/50 |
| 2011/0030737 | A1* | 2/2011 | Amano | H01L 21/67051 |
| | | | | 134/32 |
| 2019/0139756 | A1* | 5/2019 | Yamaguchi | B05B 1/30 |

FOREIGN PATENT DOCUMENTS

| | | |
|---|---|---|
| JP | 2011-054932 A | 3/2011 |
| KR | 10-2012-0028212 A | 3/2012 |

OTHER PUBLICATIONS

Translation JP5-234867 (Year: 2022).*
KR2019/0037835 (Year: 2023).*
KR20220011257 (Year: 2023).*
JP201663193 (Year: 2023).*
CN101996914 (Year: 2023).*
KR1020210066055 (Year: 2023).*
JP2002164281 (Year: 2023).*
KR20200035694 (Year: 2023).*
KR20220060057 (Year: 2502).*
KR20220059998 (Year: 2023).*
JPH5023867 (Year: 2023).*
TW504734 (Year: 2023).*

* cited by examiner

SUBSTRATE PROCESSING APPARATUS

CROSS-REFERENCE TO RELATED APPLICATION

This application claims the benefit of Japanese Patent Application No. 2019-077567 filed on Apr. 16, 2019, the entire disclosure of which is incorporated herein by reference.

TECHNICAL FIELD

The various aspects and embodiments described herein pertain generally to a substrate processing apparatus.

BACKGROUND

Conventionally, in a semiconductor manufacturing process, wet etching is performed on a substrate such as a semiconductor wafer or a glass substrate by using a chemical liquid.

Patent Document 1 describes a technique of performing the wet etching while heating a peripheral portion of the substrate.

Patent Document 1: Japanese Patent Laid-open Publication No. 2011-054932

SUMMARY

In one exemplary embodiment, a substrate processing apparatus includes a holder and a heating device. The holder is configured to hold a central portion of a bottom surface of a substrate to be rotated. The heating device is configured to supply a heated fluid to the bottom surface of the substrate. The heating device includes multiple fins, a heat source, a fluid introduction unit and a fluid discharge unit. The multiple fins are arranged along a circumferential direction of the substrate to be located under the substrate at an outer side than the holder. The heat source is configured to heat the multiple fins. The fluid introduction unit is configured to introduce the fluid to the multiple fins. The fluid discharge unit is configured to discharge the fluid, which is heated while passing through the multiple fins, to the bottom surface of the substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments for a substrate processing apparatus of the present disclosure will be described in detail with reference to the accompanying drawings. However, it should be noted that the substrate processing apparatus of the present disclosure is not limited by the exemplary embodiments. Further, the various exemplary embodiments can be appropriately combined as long as the contents of processings are not contradictory. Further, in the description of the following exemplary embodiments, same parts will be assigned same reference numerals, and redundant description will be omitted.

Further, in order to ease understanding of the following description, the X-axis direction, Y-axis direction and Z-axis direction which are orthogonal to each other are defined, and an orthogonal coordinate system in which the positive Z-axis direction is regarded as a vertically upward direction may be used in the various drawings. Further, a rotational direction around a vertical axis may be referred to as "θ direction."

<Overall Configuration of Substrate Processing Apparatus>

Figure 1:
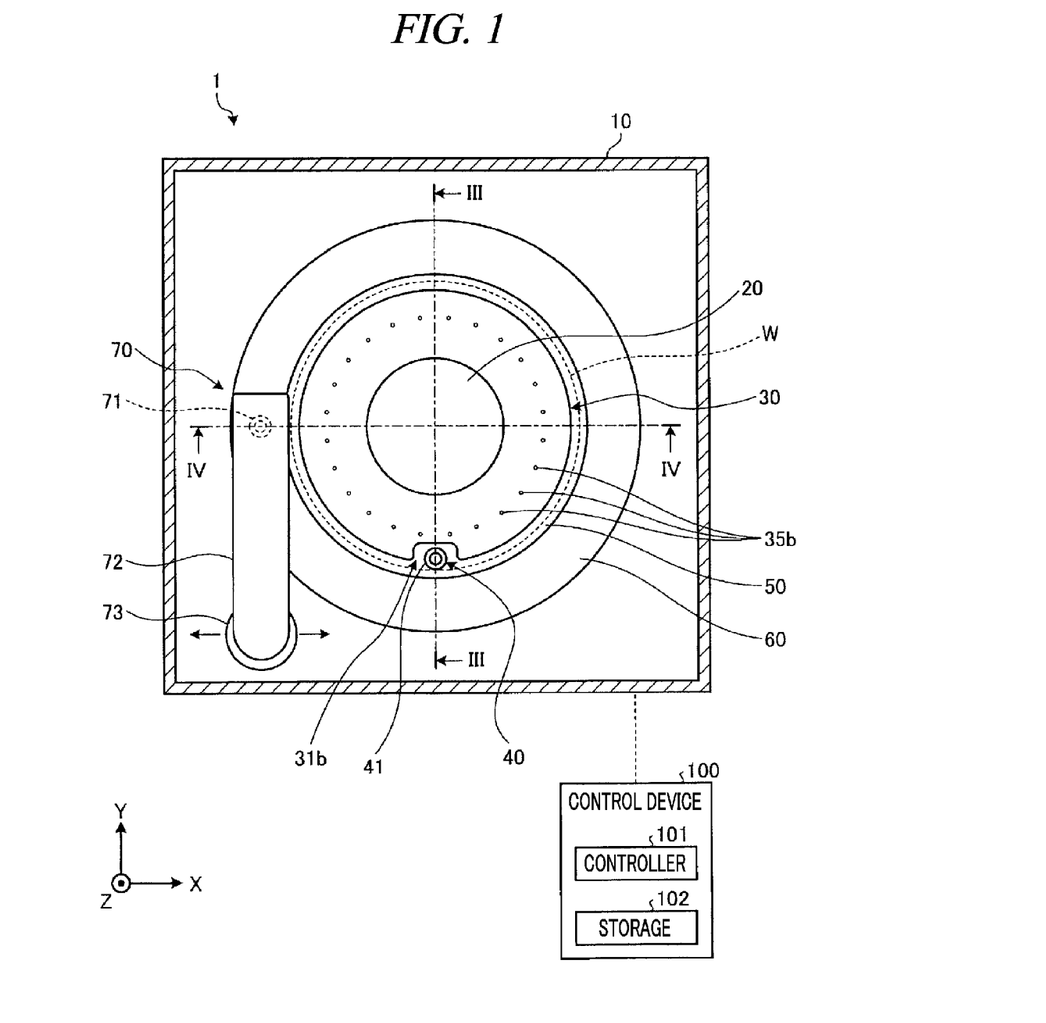
FIG. 1 is a schematic view illustrating a configuration of a substrate processing apparatus according to an exemplary embodiment.
Figure 2:
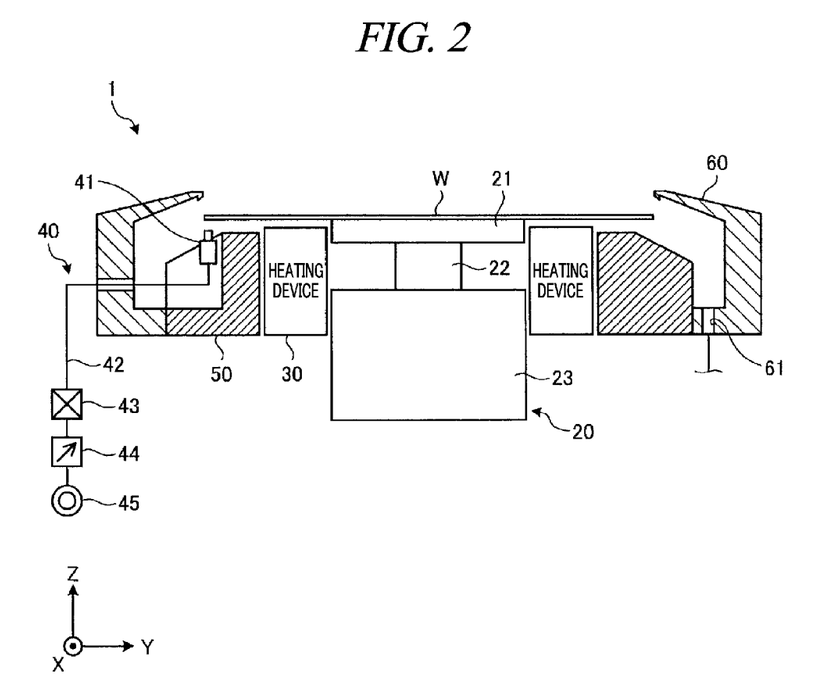
FIG. 2 is a schematic view illustrating the configuration of the substrate processing apparatus according to the exemplary embodiment.

First, a configuration of a substrate processing apparatus according to an exemplary embodiment will be explained with reference to FIG. 1 and FIG. 2. FIG. 1 and FIG. 2 are schematic diagrams illustrating the configuration of the substrate processing apparatus according to the exemplary embodiment.

As depicted in FIG. 1 and FIG. 2, a substrate processing apparatus 1 according to the exemplary embodiment is equipped with a processing vessel 10, a holder 20, a heating device 30, a bottom surface supply 40, a lower cup 50, an outer cup 60 and a top surface supply 70.

The processing vessel 10 accommodates therein the holder 20, the heating device 30, the bottom surface supply 40, the lower cup 50, the outer cup 60 and the top surface supply 70.

The holder 20 is configured to hold a wafer W rotatably. To elaborate, the holder 20 includes a vacuum chuck 21, a shaft member 22 and a driver 23. The vacuum chuck 21 is configured to attract and hold the wafer W by evacuation. The vacuum chuck 21 has a diameter smaller than that of the wafer W and attracts and holds a central portion of a bottom surface (bottom surface central portion) of the wafer W. The shaft member 22 supports the vacuum chuck 21 horizontally with a leading end thereof. The driver 23 is connected to a base end of the shaft member 22 and is configured to rotate the shaft member 22 around a vertical axis.

The heating device 30 is disposed under the wafer W to be located at an outer side than the holder 20. To be specific, the heating device 30 is disposed between the holder 20 and the lower cup 50.

The heating device 30 is configured to heat a peripheral portion of the bottom surface (bottom surface peripheral portion) of the wafer W by supplying a heated fluid to the bottom surface of the wafer W held by the holder 20. To elaborate, the heating device 30 is equipped with a multiple number of discharge openings 35b which are arranged in a circumferential direction of the wafer W. The heated fluid is supplied to the bottom surface of the wafer W from these discharge openings 35b.

Further, the bottom surface peripheral portion of the wafer W is an annular region ranging from, e.g., a width of 1 mm to 5 mm from an end surface of the wafer W.

The bottom surface supply 40 is configured to etch the bottom surface peripheral portion of the wafer W by supplying a chemical liquid to the bottom surface peripheral portion of the wafer W. Accordingly, a film formed on the bottom surface peripheral portion of the wafer W can be removed, or the bottom surface peripheral portion of the wafer W can be cleaned.

As depicted in FIG. 2, the bottom surface supply 40 is equipped with a bottom surface nozzle 41, a pipeline 42, a valve 43, a flow rate controller 44 and a chemical liquid source 45. The bottom surface nozzle 41 is disposed under the wafer W and discharges the chemical liquid upwards toward the bottom surface peripheral portion of the wafer W. The pipeline 42 connects the bottom surface nozzle 41 and the chemical liquid source 45. The valve 43 is provided at a portion of the pipeline 42 to open or close the pipeline 42. The flow rate controller 44 is provided at a portion of the pipeline 42 to adjust a flow rate of the chemical liquid flowing in the pipeline 42. The chemical liquid source 45 is, for example, a tank in which the chemical liquid is stored.

By way of non-limiting example, the chemical liquid may be hydrofluoric acid (HF), dilute hydrofluoric acid (DHF), nitrohydrofluoric acid, or the like. The nitrohydrofluoric acid is a mixed solution of hydrofluoric acid (HF) and nitric acid ($HNO_3$).

Further, the bottom surface supply 40 may be equipped with a moving device configured to move the bottom surface nozzle 41 in a horizontal direction. With this configuration, the bottom surface supply 40 is capable of moving the bottom surface nozzle 41 between a processing position under the wafer W and a retreat position at an outer side than the wafer W.

The lower cup 50 is a circular ring-shaped member which is disposed under the wafer W and is located at an outer side than the heating device 30. The lower cup 50 is formed of a member having high chemical resistance such as, but not limited to, a fluorine resin such as polytetrafluoroethylene (PTFE) or perfluoroalkoxy alkane (PFA).

The outer cup 60 is a circular ring-shaped member disposed to surround the wafer W and is configured to receive the chemical liquid or the like scattered from the wafer W. A liquid drain port 61 is formed at a bottom of the outer cup 60. The chemical liquid or the like received by the outer cup 60 is drained out from the substrate processing apparatus 1 through the liquid drain port 61 after being stored in a space formed by the outer cup 60 and the lower cup 50.

The top surface supply 70 is equipped with a top surface nozzle 71, an arm 72 and a moving device 73. The top surface nozzle 71 is disposed above the wafer W with a discharge opening facing downwards, and discharges a chemical liquid or a rinse liquid onto the top surface of the wafer W. The rinse liquid may be, by way of example, deionized water (DIW). The arm 72 extends horizontally and supports the top surface nozzle 71 with a leading end thereof. The moving device 73 is connected to a base end of the arm 72, and moves the arm 72 in, for example, the horizontal direction (here, the X-axis direction). Accordingly, the top surface nozzle 71 can be moved between a processing position above the wafer W and a retreat position at an outer side than the wafer W.

Furthermore, as illustrated in FIG. 1, the substrate processing apparatus 1 according to the exemplary embodiment is equipped with a control device 100. The control device 100 is, for example, a computer, and includes a controller 101 and a storage 102. The storage 102 is implemented by, by way of non-limiting example, a semiconductor memory device such as a RAM (Random Access Memory) or a flash memory, or a storage device such as a hard disk or an optical disk. The storage 102 stores therein a program for controlling various processing performed in the substrate processing apparatus 1. The controller 101 includes various circuits and a microcomputer having a CPU (Central Processing Unit), a ROM (Read Only Memory), a RAM, an input/output port, and so forth. The controller 101 reads out and executes the program stored in the storage 102, thus controlling an operation of the substrate processing apparatus 1.

Further, this program may be recorded in a computer-readable recording medium and installed from the recording medium to the storage 102 of the control device 100. The computer-readable recording medium may be, for example, a hard disc (HD), a flexible disc (FD), a compact disc (CD), a magnet optical disc (MO), or a memory card.

<Configuration of Heating Device>

Figure 3:
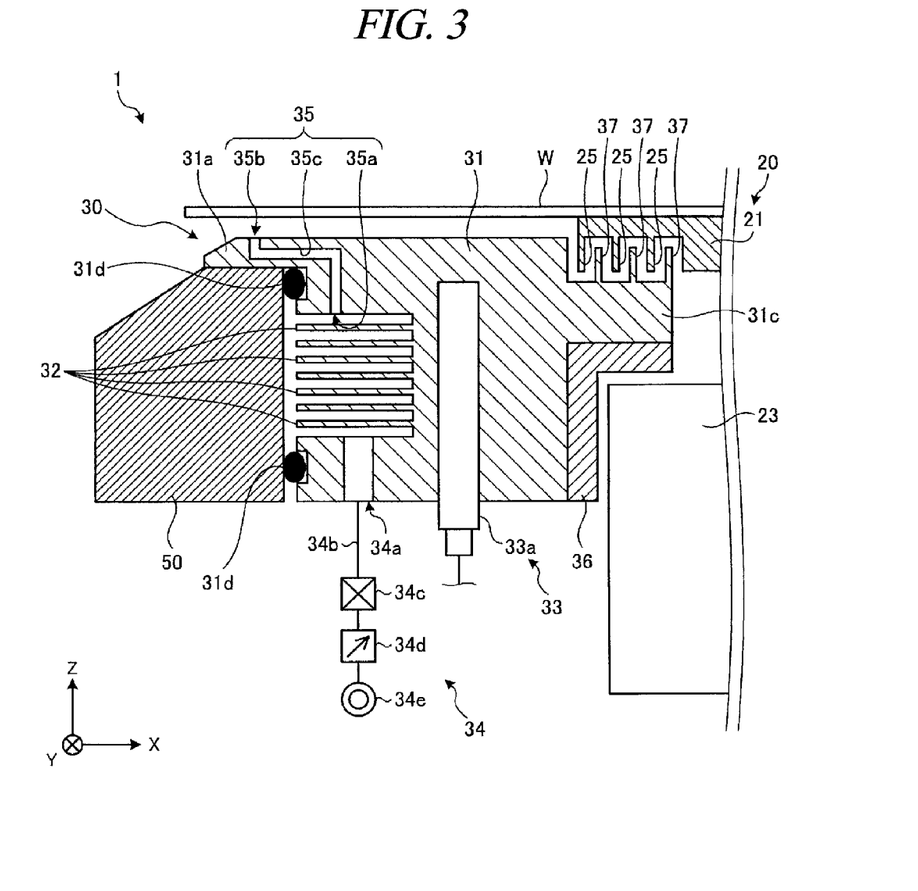
FIG. 3 is a schematic cross sectional view of a heating device according to the exemplary embodiment.
Figure 4:
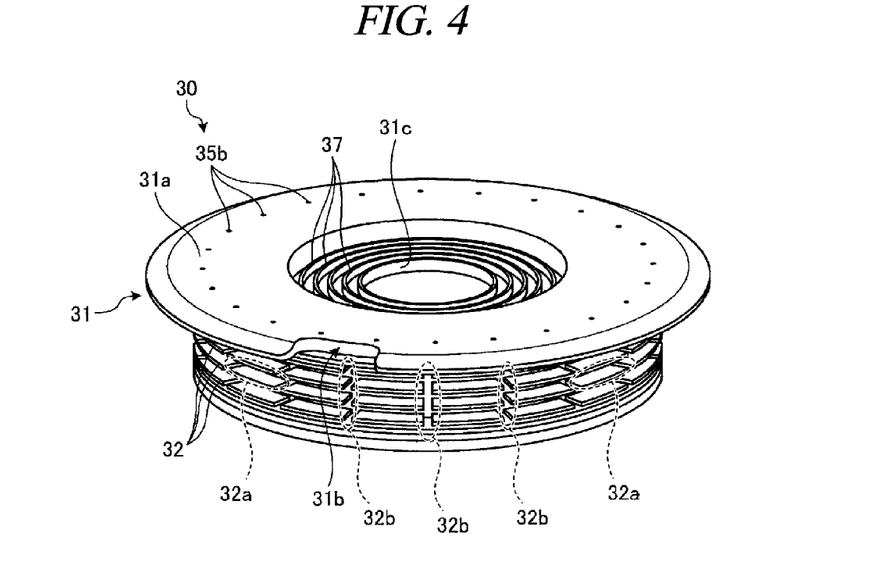
FIG. 4 is a schematic perspective view of the heating device according to the exemplary embodiment.
Figure 5:
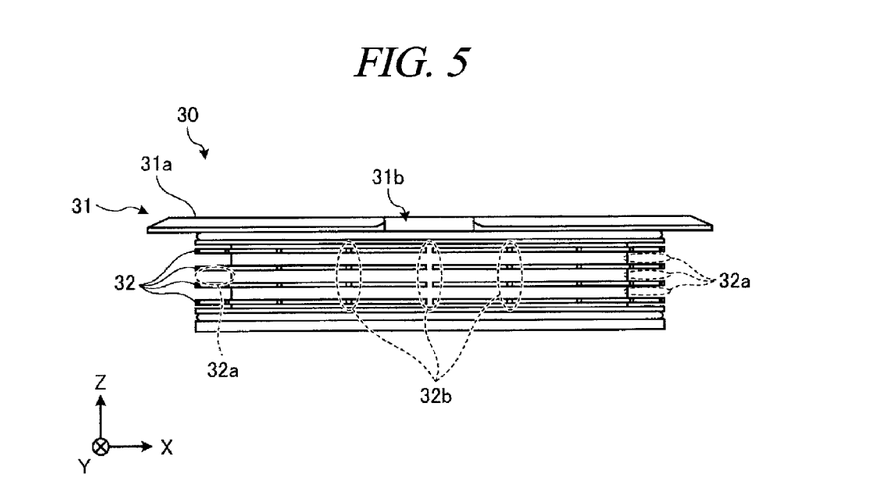
FIG. 5 is a schematic side view of the heating device according to the exemplary embodiment.
Figure 6:
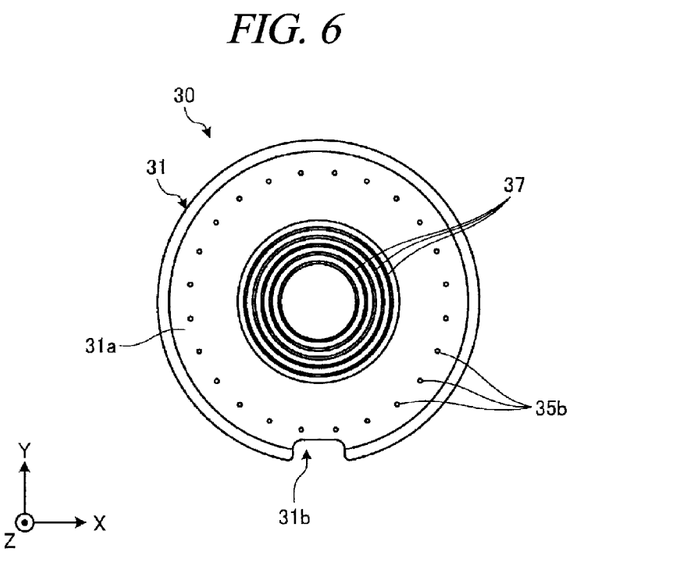
FIG. 6 is a schematic plan view of the heating device according to the exemplary embodiment.
Figure 7:
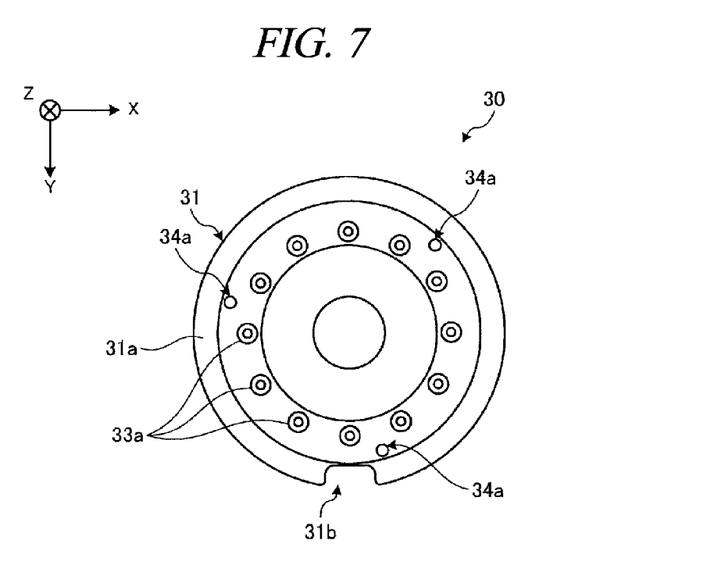
FIG. 7 is a schematic bottom view of the heating device according to the exemplary embodiment.

Now, a configuration of the heating device 30 will be discussed with reference to FIG. 3 to FIG. 7. FIG. 3 is a schematic cross sectional view illustrating the heating device 30 according to the exemplary embodiment. FIG. 4 is a schematic perspective view of the heating device 30 according to the exemplary embodiment, and FIG. 5 is a schematic side view of the heating device 30 according to the exemplary embodiment. FIG. 6 is a schematic plan view of the heating device 30 according to the exemplary embodiment, and FIG. 7 is a schematic bottom view of the heating device 30 according to the exemplary embodiment.

As illustrated in FIG. 3, the heating device 30 is equipped with a main body 31, a multiple number of fins 32, a heat source 33, a fluid introduction unit 34 and a fluid discharge unit 35. Further, the heating device 30 is also equipped with a heat insulating member 36 and a plurality of second labyrinth members 37.

(Main Body 31)

The main body 31 is made of a material having high thermal conductivity, for example, aluminum. The main body 31 has a circular ring shape (see FIG. 4) and is disposed between the holder 20 and the lower cup 50.

A circular ring-shaped first flange 31a extending outwards in a diametrical direction of the main body 31 is formed at an upper portion of the main body 31. A plurality of discharge openings 35b is opened at a top surface of the first flange 31a (see FIG. 4 and FIG. 6). Further, the first flange 31a is provided with a notch 31b formed inwards from an end portion of the first flange 31a in the diametrical direction. The bottom surface nozzle 41 is placed in this notch 31b (see FIG. 1).

Further, a circular ring-shaped second flange 31c extending inwards (that is, toward the holder 20) in the diametrical direction of the main body 31 is formed at an inner peripheral portion of the main body 31. The second labyrinth members 37 are formed at a top surface of the second flange 31c.

Further, as illustrated in FIG. 3, the main body 31 is provided with a plurality of seal members 31d at an outer peripheral portion thereof, and is in contact with the lower cup 50 with the seal members 31d therebetween. The seal members 31d may be, by way of non-limiting example, O-rings. Here, two seal members 31d are provided: one is located above the multiple number of fins 32 to be described later and the other is located under the fins 32.

In addition, at least a top surface of the main body 31, that is, at least a surface of the main body 31 facing the bottom surface of the wafer W may be coated with, for example, a material having chemical resistance. The material having the chemical resistance may be, by way of non-limiting example, a fluorine resin such as PTFE or PFA. As stated above, if there is a concern that chemical liquid may attach to a certain portion of the main body 31, by coating this portion with the material having the high chemical resistance, it is possible to suppress corrosion of the main body 31 caused by the chemical liquid while improving heating efficiency.

(Fins 32)

The multiple number of fins 32 are arranged along the circumferential direction of the wafer W to be located under the wafer W at an outer side than the holder 20. To elaborate, the multiple number of fins 32 are formed at the outer peripheral portion of the main body 31. Further, the fins 32 are disposed at an inner side than the peripheral portion of the wafer W in a diametrical direction thereof.

Each of the multiple number of fins 32 extends along a circumferential direction of the main body 31 (that is, the circumferential direction of the wafer W) (see FIG. 4 and FIG. 5). Further, the multiple number of fins 32 are arranged at a regular distance therebetween in a height direction (see FIG. 3 and FIG. 5). Accordingly, flow paths 32a extending in the circumferential direction of the main body 31 are formed between the neighboring fins 32 adjacent to each other in the height direction. Further, the multiple number of fins 32 are arranged at a regular distance therebetween in the circumferential direction. Accordingly, flow paths 32b extending in a vertical direction are formed between the neighboring fins 32 adjacent to each other in the circumferential direction.

(Heat Source 33)

The heat source 33 is disposed near the multiple number of fins 32 and heats these fins 32. The heat source 33 is equipped with a multiple number of heating elements 33a extending in a stacking direction (Z-axis direction) of the fins 32. Each heating element 33a is, for example, a rod-shaped member prepared by covering a nichrome wire with a pipe made of a metal and is inserted into the main body 31 from below the main body 31.

As depicted in FIG. 3, in a state that the heating element 33a is inserted in the main body 31, the heating element 33a extends to be higher than the uppermost fin 32 and lower than the lowermost fin 32 among the multiple number of fins 32. Further, as illustrated in FIG. 7, the multiple number of heating elements 33a are arranged at a regular distance therebetween along the circumferential direction of the main body 31.

As stated above, by arranging the multiple number of heating elements 33a, each of which extends in the stacking direction of the multiple number of fins 32, along the circumferential direction of the main body 31, the multiple number of fins 32 can be heated uniformly.

Further, the multiple number of heating elements 33a are disposed at an inner side than the multiple number of fins 32 in the diametrical direction of the main body 31. That is, the multiple number of fins 32 are disposed at an outer side than the multiple number of heating elements 33a in the diametrical direction of the main body 31. As stated above, by disposing the multiple number of fins 32 at the outer side of the main body 31, a surface area of the multiple number of fins 32 can be enlarged as compared to a case where the multiple number of fins 32 are arranged at the inner side of the main body 31. Accordingly, heating efficiency for the bottom surface peripheral portion of the wafer W can be improved without increasing a size of the main body 31, for example.

(Fluid Introduction Unit 34)

The fluid introduction unit 34 is equipped with a plurality of introduction openings 34a, a pipeline 34b, a valve 34c, a flow rate controller 34d and a fluid source 34e.

As shown in FIG. 7, the plurality of introduction openings 34a are opened at a bottom surface of the main body 31 and arranged at a regular distance therebetween along the circumferential direction of the main body 31. In this exemplary embodiment, three introduction openings 34a are formed, for example. However, the number of the introduction openings 34a is not limited to three. The fluid introduction unit 34 needs to be provided with at least one introduction opening 34a.

The pipeline 34b connects the plurality of introduction openings 34a and the fluid source 34e. The valve 34c is provided at a portion of the pipeline 34b, and closes or opens the pipeline 34b. The flow rate controller 34d is provided at a portion of the pipeline 34b, and adjusts a flow rate of a fluid flowing in the pipeline 34b. The fluid source 34e is, for example, a tank which stores therein the fluid. In the present exemplary embodiment, the fluid source 34e stores a $N_2$ gas of a room temperature.

The fluid introduction unit 34 is configured as stated above, and the $N_2$ gas of the room temperature stored in the fluid source 34e is supplied into the plurality of introduction openings 34a via the pipeline 34b and discharged toward a bottom surface of the lowermost fin 32 from the plurality of introduction openings 34a (see FIG. 3).

(Fluid Discharge Unit 35)

The fluid discharge unit 35 is equipped with a plurality of inlet openings 35a, the plurality of discharge openings 35b and a plurality of flow paths 35c.

The plurality of inlet openings 35a are disposed at an inner side than the peripheral portion of the wafer W in the diametrical direction, and the fluid which is heated while it passes through the multiple number of fins 32 is introduced into the inlet openings 35a.

To elaborate, the plurality of inlet openings 35a are opened at a surface of the main body 31 facing the uppermost fin 32 among the multiple number of fins 32, and these inlet openings 35a are arranged at a regular distance therebetween along the circumferential direction of the main body 31.

The plurality of discharge openings 35b are formed at the top surface of the first flange 31a of the main body 31 and arranged at a regular distance therebetween in the circumferential direction of the main body 31 (see FIG. 4 and FIG. 6). The flow paths 35c allow the inlet openings 35a and the discharge openings 35b to communicate with each other.

As depicted in FIG. 3, the plurality of discharge openings 35b are formed at an outer side than the plurality of introduction openings 34a in the diametrical direction of the main body 31. That is, in the diametrical direction of the wafer W, the plurality of discharge openings 35b are provided at a position closer to the bottom surface peripheral portion of the wafer W than the plurality of inlet openings 35a are close to the bottom surface peripheral portion of the wafer W.

(Heat Insulating Member 36)

The heat insulating member 36 is disposed at an outer side than the holder 20 and an inner side than the multiple number of fins 32 and the heat source 33. To be specific, the heat insulating member 36 is provided on an inner circumferential surface of the main body 31 and a bottom surface of the second flange 31c. Further, the heat insulating member 36 may be also provided within the second flange 31c. By providing the heat insulating member 36 as stated above, heat from the main body 31 heated by the heat source 33 can be suppressed from being transferred to the holder 20.

(Second Labyrinth Members 37)

Each of the plurality of second labyrinth members 37 has a circular ring shape, and the plurality of second labyrinth members 37 are arranged concentrically at a regular distance therebetween (see FIG. 4 and FIG. 6).

A plurality of first labyrinth members 25 is formed at a bottom surface of the vacuum chuck 21. Each of the plurality of first labyrinth members 25 has a circular ring shape, and the plurality of first labyrinth members 25 are arranged concentrically at a regular distance therebetween.

The plurality of second labyrinth members 37 are overlapped with the plurality of first labyrinth members 25 in the height direction and are arranged alternately with the plurality of first labyrinth members 25.

If the holder 20 and the wafer W are rotated, cold air (not heated) may be introduced into a gap between the wafer W and the main body 31 through a gap between the vacuum chuck 21 and the main body 31 due to a vortex flow created by the rotation thereof. As a result, the heating efficiency of the heating device 30 may be deteriorated.

As a resolution, in the substrate processing apparatus 1 according to the present exemplary embodiment, a labyrinth structure formed by the plurality of first labyrinth members 25 and the plurality of second labyrinth members 37 is provided in the gap between the holder 20 and the main body 31. By providing the labyrinth structure at this position, it becomes difficult for the cold air (not heated) to be introduced into the gap between the wafer W and the main body 31. Therefore, deterioration of the heating efficiency of the heating device 30 can be suppressed.

(Operation of Heating Device 30)

As depicted in FIG. 3, the heating device 30 and the lower cup 50 are in contact with each other with the ring-shaped seal members 31d, which are provided at the outer peripheral portion of the heating device 30, therebetween. The ring-shaped seal members 31d are provided at the positions above and under the multiple number of fins 32, respectively. With this configuration, the multiple number of fins 32 are accommodated in a space (hereinafter, referred to as "heating space") surrounded by the heating device 30, the lower cup 50 and the seal members 31d.

In the heating device 30, the main body 31 is first heated by the heat source 33. As the main body 31 is heated, the multiple number of fins 32 formed at the main body 31 are heated.

Subsequently, the $N_2$ gas of the room temperature is discharged from the introduction openings 34a toward the bottom surface of the lowermost fin 32 among the multiple number of fins 32. In this way, in the heating device 30, the $N_2$ gas having the room temperature is supplied from under the heating space.

The $N_2$ gas having the room temperature supplied into the heating space is heated by the multiple number of fins 32 which are accommodated in the heating space. At this time, the $N_2$ gas is uniformly diffused into the heating space by passing through the flow paths 32a which are gaps between the fins 32 adjacent to each other in the height direction and the flow paths 32b which are gaps between the fins 32 adjacent to each other in the circumferential direction. In this way, by allowing the $N_2$ gas to be diffused in the heating space uniformly, the heating of the $N_2$ gas by the fins 32 can be carried out efficiently.

Furthermore, the introduction openings 34a as inlets of the heating space are formed under the heating space, and the inlet openings 35a as outlets of the heating space are formed above the heating space. As a result, an upward flow of the $N_2$ gas is formed in the heating space. Accordingly, the $N_2$ gas introduced into the heating space is allowed to come into more secure contact with the multiple number of fins 32 arranged in the height direction. Therefore, the heating of the $N_2$ gas by the fins 32 can be carried out more efficiently.

Moreover, since the heating space is sealed by the lower cup 50 and the seal members 31d as stated above, a leak of the heated $N_2$ gas from a place other than the inlet openings 35a is suppressed. Therefore, the heating of the $N_2$ gas by the fins 32 can be performed efficiently.

In addition, since the lower cup 50 is made of a member, such as fluorine resin, having high chemical resistance, thermal conductivity of the lower cup 50 is lower than that of the main body 31. Accordingly, the lower cup 50 also serves as a heat insulating member for the heating space. Thus, heat dissipation from the heating space can be suppressed without providing an additional heating insulating member.

The heated $N_2$ gas introduced into the inlet openings 35a (hereinafter, referred to as "hot $N_2$ gas") is discharged toward the bottom surface of the wafer W from the discharge openings 35b via the flow paths 35c. Accordingly, as the hot $N_2$ gas is supplied to the bottom surface peripheral portion of the wafer W, the bottom surface peripheral portion of the wafer W is heated. By supplying the chemical liquid to the bottom surface peripheral portion of the wafer W from the bottom surface nozzle 41 while heating the bottom surface peripheral portion of the wafer W, the etching processing upon the bottom surface peripheral portion of the wafer W by the chemical liquid can be completed in a short time period.

The discharge openings 35b are provided at the outer side than the inlet openings 35a in the diametrical direction of the wafer W. In this way, by providing the discharge openings 35b at a position closer to the bottom surface peripheral portion of the wafer W than the inlet openings 35a is close to the bottom surface peripheral portion of the wafer W in the diametrical direction of the wafer W, a heat loss that might be caused until the heated $N_2$ gas reaches the bottom surface peripheral portion of the wafer W can be reduced. Therefore, the bottom surface peripheral portion of the wafer W can be heated more efficiently.

As described above, with the heating device 30 according to the exemplary embodiment, the bottom surface peripheral portion of the wafer W can be heated efficiently.

Recently, as a substrate gets thinner with a larger diameter, the substrate may be easily bent. To correct the bending of the substrate and maintain the substrate in a flat state, the vacuum chuck is also required to have a large diameter. Furthermore, recently, it is also required to etch a peripheral portion of a bottom surface of the substrate in a wider range. To meet such a requirement, the bottom surface nozzle tends to be placed to correspond to an inner side of the substrate as compared to conventional cases. As a result, a space for installation of the heating device, which is supposed to be disposed between the holder and the bottom surface nozzle, tends to be narrowed.

With the heating device 30 according to the present exemplary embodiment, however, since the bottom surface peripheral portion of the wafer W can be heated efficiently, the main body 31 can be scaled down, and the main body 31 can be easily installed in the narrow space.

Modification Examples

Figure 8:
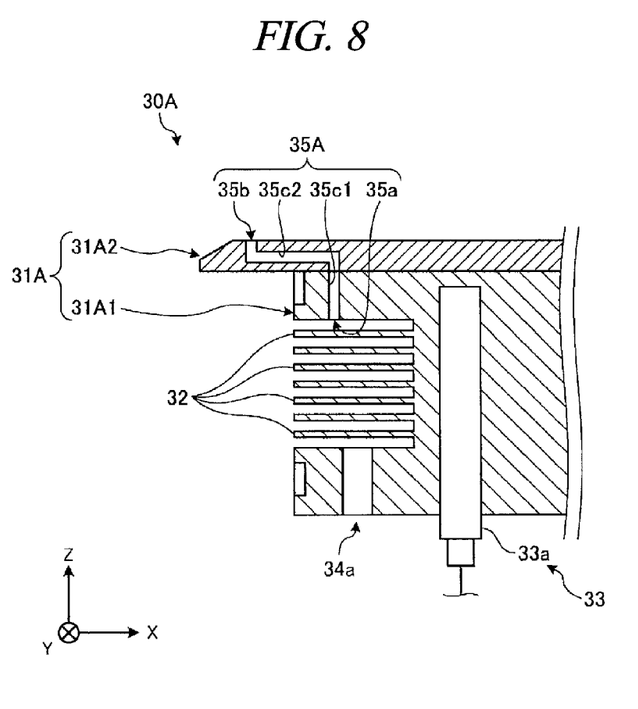
FIG. 8 is a schematic cross sectional view of a heating device according to a first modification example.

FIG. 8 is a schematic cross sectional view illustrating a heating device according to a first modification example. As depicted in FIG. 8, a heating device 30A according to the first modification example includes a main body 31A. The main body 31A has the same shape as the main body 31 according to the above-described exemplary embodiment.

The main body 31A according to the first modification example is divided into a first main body 31A1 provided with the multiple number of fins 32 and a second main body 31A2 provided with a fluid discharge unit 35A. The first main body 31A1 has a cylindrical shape, and the multiple number of fins 32 are formed at the outer peripheral portion thereof. Further, the second main body 31A2 has a cylindrical shape with a smaller thickness and a larger diameter than those of the first main body 31A1. As the second main body 31A2 is mounted on top of the first main body 31A1, the main body 31A having the same shape as the main body 31 is prepared.

The fluid discharge unit 35A according to the first modification example has a first flow path 35c1 formed in the first main body 31A1 and a second flow path 35c2 formed in the second main body 31A2. The first flow path 35c1 is a straight line-shaped flow path extending in the vertical direction. The first flow path 35c1 and the second flow path 35c2 are connected to each other as the second main body 31A2 is assembled to the first main body 31A1, so that a flow path having the same shape as the flow path 35c is formed.

As described above, the main body 31A is configured to be divided into the first main body 31A1 provided with the multiple number of fins 32 and the second main body 31A2 provided with the fluid discharge unit 35A. By configuring the main body 31A to be divided into these individual parts, only the first flow path 35c1, between the first flow path 35c1 and the second flow path 35c2, having the straight line shape needs to be formed in the first main body 31A1, for example. Thus, the manufacture of the first main body 31A1 is eased.

Furthermore, by configuring the main body 31A to be divided into the first main body 31A1 and the second main body 31A2, the first main body 31A1 and the second main body 31A2 can be made of different materials.

By way of example, the first main body 31A1 may be made of a material having thermal conductivity higher than that of the second main body 31A2, and the second main body 31A2 may be made of a material having chemical resistance higher than that of the first main body 31A1. In such a case, the first main body 31A1 may be made of a metal such as, but not limited to, aluminum, and the second main body 31A2 may be made of a fluorine resin such as, but not limited to, PTFE or PFA.

By adopting the above-described configuration, it is possible to suppress corrosion of the main body 31A caused by the chemical liquid while improving the heating efficiency, for example.

In addition, since the second main body 31A2 is made of the material having lower thermal conductivity than that of the first main body 31A1, the heat loss that might be caused when the hot $N_2$ gas flows in the first flow path 35c1 can be reduced. Therefore, the heating efficiency for the bottom surface peripheral portion of the wafer W can be improved.

The above exemplary embodiment has been described for the example case where each fin 32 has the shape extending along the circumferential direction. However, each fin 32 may extend in the height direction.

Figure 9:
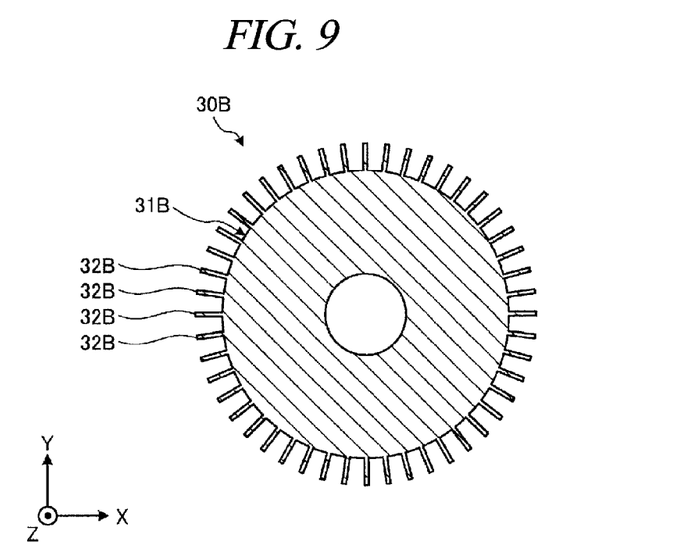
FIG. 9 is a schematic plan view of a heating device according to a second modification example.

FIG. 9 is a schematic plan view of a heating device according to a second modification example. Further, FIG. 10 is a schematic perspective view of fins belonging to the heating device according to the second modification example.

Figure 10:
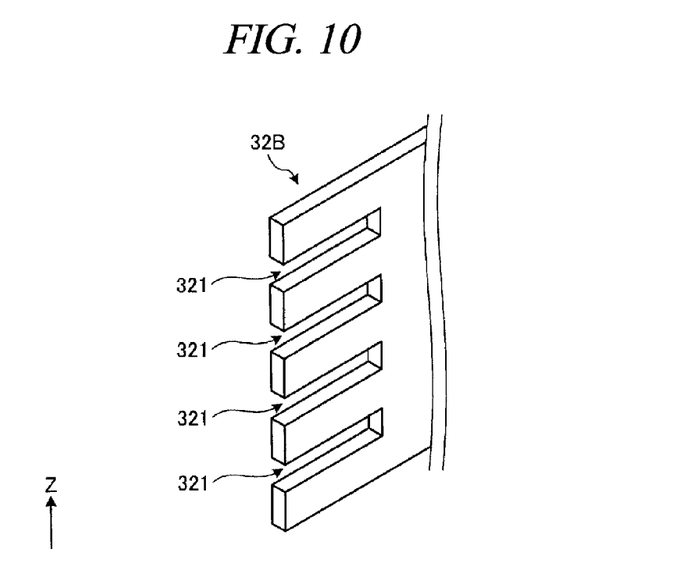
FIG. 10 is a schematic perspective view of fins belonging to the heating device according to the second modification example.

As depicted in FIG. 9 and FIG. 10, a heating device 30B according to the second modification example is equipped with a multiple number of fins 32B extending in a height direction. These fins 32B are formed at an outer peripheral portion of a main body 31B of the heating device 30B and arranged at a regular distance therebetween in a circumferential direction.

As shown in FIG. 10, each fin 32B is provided with multiple flow path portions 321 which are formed by cutting off the fin 32B inwards from an outer periphery thereof. These flow path portions 321 are arranged at a regular distance therebetween in the height direction. By forming these multiple flow path portions 321 at the fin 32B, the $N_2$ gas is allowed to be diffused in the heating space uniformly.

The above exemplary embodiment has been described for the example case where the substrate processing apparatus 1 is equipped with the circular ring-shaped main body 31; and the multiple number of fins 32 are arranged in the circular ring shape. However, the main body 31 and the fins 32 only need to be disposed along the circumferential direction of the wafer W and need not always be of the circular ring shape. By way of example, the main body of the heating device may have a circular arc shape when viewed from the top. In this case, the multiple number of fins may be arranged in a circular arc shape at an outer peripheral portion or an inner peripheral portion of the circular arc-shaped main body.

The above exemplary embodiment has been described for the example case where the substrate processing apparatus 1 is equipped with the bottom surface nozzle 41; and the bottom surface peripheral portion of the wafer W is etched by supplying the chemical liquid to the bottom surface peripheral portion of the wafer W from the bottom surface nozzle 41. However, the exemplary embodiment is not limited thereto, and the substrate processing apparatus 1 may etch a peripheral portion of the top surface (top surface peripheral portion) of the wafer W by supplying the chemical liquid to the top surface peripheral portion of the wafer W by using the top surface nozzle 71 while heating the bottom surface peripheral portion of the wafer W with the heating device 30 (30A, 30B), for example. Further, the substrate processing apparatus 1 may supply the chemical liquid to a top surface central portion of the wafer W with the top surface nozzle 71 while heating the bottom surface peripheral portion of the wafer W by using the heating device 30 (30A, 30B). Accordingly, a temperature decrease of the chemical liquid at the outer peripheral portion of the wafer W can be suppressed, so that the deterioration of in-surface uniformity of the etching processing can be suppressed.

The above exemplary embodiment has been described for the example case where the $N_2$ gas of the room temperature is supplied from the fluid introduction unit 34. However, the fluid supplied from the fluid introduction unit 34 may be an inert gas (for example, an argon gas) other than the $N_2$ gas. Further, the fluid supplied from the fluid introduction unit 34 is not limited to the inert gas, and may be air such as dry air, or another gas. Furthermore, the fluid supplied from the fluid introduction unit 34 may be a vapor such as water vapor, or a liquid such as water.

As stated above, the substrate processing apparatus (as an example, the substrate processing apparatus 1) according to the exemplary embodiment is equipped with a holder (as an example, the holder 20) and a heating device (as an example, the heating device 30 (30A, 30B)). The holder is configured to hold a central portion of a bottom surface of a substrate (as an example, the wafer W) rotatably. The heating device is configured to supply a heated fluid (as an example, the hot $N_2$ gas) to the bottom surface of the substrate held by the holder. Further, the heating device includes a multiple number of fins (as an example, the multiple number of fins 32); a heat source (as an example, the heat source 33), a fluid introduction unit (as an example, the fluid introduction unit 34), and a fluid discharge unit (as an example, the fluid discharge unit 35 (35A)). The multiple number of fins are arranged along a circumferential direction of the substrate to be located under the substrate at an outer side than the holder. The heat source is configured to heat the multiple number of fins. The fluid introduction unit is configured to introduce a fluid (as an example, the $N_2$ gas of the room temperature) to the fins. The fluid discharge unit is configured to discharge the fluid, which is heated while it passes through the fins, to the bottom surface of the substrate.

By arranging the multiple number of fins along the circumferential direction of the substrate to be located under the substrate at the outer side than the holder, the fluid heated by the multiple number of fins can be supplied to a peripheral portion of the bottom surface of the substrate efficiently. Accordingly, heating efficiency for the peripheral portion of the bottom surface of the substrate can be improved. Furthermore, since the peripheral portion of the bottom surface of the substrate can be heated efficiently, the heating device can be scaled down, and, thus, the heating device can be easily installed in a narrow space.

The multiple number of fins may be arranged at a regular distance therebetween in a height direction. Accordingly, as compared to a case where the multiple number of fins are arranged along, for example, a diametrical direction of the substrate, a size of the heating device in the diametrical direction of the substrate can be reduced. Therefore, even if the space for the installation of the heating device is narrow in the diametrical direction of the substrate, the heating device can still be easily installed in this narrow space.

The multiple number of fins may be arranged at a regular distance therebetween in the circumferential direction. With this configuration, flow paths (as an example, flow paths 32b) extending in the height direction can be formed between the fins adjacent to each other in the circumferential direction. As the fluid flows along these flow paths 32b, the fluid is allowed to come into contact with all of the multiple number of fins arranged in the circumferential direction. Therefore, the fluid can be heated efficiently, and the heating efficiency for the bottom surface peripheral portion of the substrate can be further improved.

The heat source may have heating elements (as an example, the heating elements 33a) extending in the height direction. With this configuration, the multiple number of fins arranged in the height direction can be heated uniformly.

The multiple number of fins may be disposed at an outer side than the heat source. By disposing the multiple number of fins at the outer side than the heat source, a surface area of the multiple number of fins can be increased as compared to a case where the multiple number of fins are disposed at the inner side than the heat source. Thus, the heating efficiency for the bottom surface peripheral portion of the substrate can be improved without accompanying, for example, the scale-up of the heating device.

The substrate processing apparatus according to the exemplary embodiment may be further equipped with a heat insulating member (as an example, the heat insulating member 36) which is disposed at an outer side than the holder and an inner side than the fins and the heat source. With this configuration, the heat from the heating device can be suppressed from being transferred to the holder.

The fluid discharge unit may be equipped with inlet openings (as an example, the inlet openings 35a), discharge openings (as an example, the discharge openings 35b) and flow paths (as an example, the flow paths 35c). The inlet openings are provided at an inner side than the peripheral portion of the substrate, and the fluid heated while it passes through the multiple number of fins is introduced into the inlet openings. The discharge openings are provided at an outer side than the inlet openings and opened toward the bottom surface of the substrate. The flow paths allow the inlet openings and the discharge openings to communicate with each other.

As stated above, by providing the discharge openings at positions closer to the bottom surface peripheral portion of the substrate as compared to the inlet openings in the diametrical direction of the substrate, a heat loss that might be caused until the heated fluid reaches the bottom surface peripheral portion of the substrate can be reduced. Therefore, the bottom surface peripheral portion of the substrate can be heated more efficiently.

The heating device (as an example, the main body 31A) may be equipped with a first main body (as an example, the first main body 31A1) provided with the multiple number of fins and a second main body (as an example, the second main body 31A2) provided with the fluid discharge unit (as an example, the fluid discharge unit 35A). In this configuration, the first main body may be made of a material having thermal conductivity higher than that of the second main body, and the second main body may be made of a material having chemical resistance higher than that of the first main body. Thus, it is possible to suppress corrosion of the heating device by the chemical liquid while being capable of increasing the heating efficiency.

At least a surface of the heating device (as an example, the main body 31) facing the bottom surface of the substrate may be coated with a material having chemical resistance. If there is a concern that the chemical liquid may attach to a certain portion of the heating device, by coating this portion with the material having the high chemical resistance, the heating efficiency can be improved and the corrosion of the heating device by the chemical liquid can be suppressed.

The substrate processing apparatus according to the exemplary embodiment may be equipped with a nozzle (as an example, the bottom surface nozzle 41) configured to discharge the chemical liquid to the bottom surface peripheral portion of the substrate. By supplying the chemical liquid to the bottom surface peripheral portion of the substrate from the nozzle while heating the bottom surface peripheral portion of the substrate with the heating device, the etching processing upon the bottom surface peripheral portion of the substrate with the chemical liquid can be completed in a short time period.

The holder may be equipped with a multiple number of first labyrinth members (as an example, the first labyrinth members 25) extending in the circumferential direction and arranged at a regular distance therebetween. In this case, the heating device may be further equipped with a multiple number of second labyrinth members (as an example, the second labyrinth members 37) extending in the circumferential direction and arranged alternately with the multiple number of first labyrinth members.

By providing this labyrinth structure in a gap between the holder and the heating device, it becomes difficult for cold air (not heated) to be introduced into a gap between the substrate and the heating device. Therefore, the deterioration of the heating efficiency of the heating device can be suppressed.

According to the exemplary embodiment, it is possible to heat the bottom surface peripheral portion of the substrate efficiently.

It will be appreciated that the various exemplary embodiments of the present disclosure are not intended to be limiting, and that various modifications may be made therefrom. Further, the above-described exemplary embodiments may be omitted, substituted or changed in various ways without departing from the scope and spirit of the following claims.

We claim:

1. A substrate processing apparatus, comprising:
    a holder configured to hold a central portion of a bottom surface of a substrate to be rotated; and
    a heating device configured to supply a heated fluid to the bottom surface of the substrate,
    wherein the heating device comprises:
    a main body having a ring shape with introduction openings at a bottom surface of the main body and discharge openings at a top surface of the main body;
    multiple fins disposed at an outer peripheral portion of the main body and arranged along a circumferential direction of the substrate to be located under the substrate at an outer side than the holder;
    a heat source in the main body and configured to heat the multiple fins;
    a fluid introduction unit configured to introduce the fluid to the multiple fins through the introduction openings; and
    a fluid discharge unit configured to discharge the fluid, which is heated while passing through the multiple fins, through the discharge openings to the bottom surface of the substrate;
    wherein the multiple fins are disposed at an outer side than the heat source and extend radially outwardly from the main body.

2. The substrate processing apparatus of claim 1, wherein the multiple fins are arranged at a uniform distance therebetween in an axial direction.

3. The substrate processing apparatus of claim 2, wherein the multiple fins are arranged at a uniform distance in the circumferential direction.

4. The substrate processing apparatus of claim 3, wherein the heat source comprises a heating element extending in the axial direction.

5. The substrate processing apparatus of claim 2, wherein the heat source comprises a heating element extending in the axial direction.

6. The substrate processing apparatus of claim 2, further comprising:
    a heat insulating member disposed at an outer side than the holder and an inner side than the multiple fins and the heat source.

7. The substrate processing apparatus of claim 2, wherein the fluid discharge unit comprises:
    an inlet opening which is provided at an inner side than a peripheral portion of the substrate and through which the fluid, which is heated while passing through the multiple fins, is introduced;
    one of the discharge openings provided at an outer side than the inlet opening and opened toward the bottom surface of the substrate; and
    a flow path through which the inlet opening and the one of the discharge openings communicate with each other.

8. The substrate processing apparatus of claim 2, wherein the heating device comprises:
    a first main body provided with the multiple fins; and
    a second main body provided separately from the first main body and provided with the fluid discharge unit,
    wherein the first main body is made of a material having thermal conductivity greater than that of the second main body, and
    the second main body is made of a material having chemical resistance greater than that of the first main body.

9. The substrate processing apparatus of claim 2, wherein at least a surface of the heating device facing the bottom surface of the substrate is coated with a material having chemical resistance.

10. The substrate processing apparatus of claim 2, further comprising:
    a nozzle configured to discharge a chemical liquid to a peripheral portion of the bottom surface of the substrate.

11. The substrate processing apparatus of claim 2, wherein the holder comprises multiple first labyrinth members, extending in the circumferential direction, arranged at a uniform distance therebetween, and
    the heating device comprises multiple second labyrinth members, extending in the circumferential direction, arranged alternately with the multiple first labyrinth members.

12. The substrate processing apparatus of claim 1, further comprising:
a heat insulating member disposed at an outer side than the holder and an inner side than the multiple fins and the heat source.

13. The substrate processing apparatus of claim 1, wherein the fluid discharge unit comprises:
an inlet opening which is provided at an inner side than a peripheral portion of the substrate and through which the fluid, which is heated while passing through the multiple fins, is introduced;
one of the discharge openings provided at an outer side than the inlet opening and opened toward the bottom surface of the substrate; and
a flow path through which the inlet opening and the one of the discharge openings communicate with each other.

14. The substrate processing apparatus of claim 1, wherein the heating device comprises:
a first main body provided with the multiple fins; and
a second main body provided separately from the first main body and provided with the fluid discharge unit,
wherein the first main body is made of a material having thermal conductivity greater than that of the second main body, and
the second main body is made of a material having chemical resistance greater than that of the first main body.

15. The substrate processing apparatus of claim 1, wherein at least a surface of the heating device facing the bottom surface of the substrate is coated with a material having chemical resistance.

16. The substrate processing apparatus of claim 1, further comprising:
a nozzle configured to discharge a chemical liquid to a peripheral portion of the bottom surface of the substrate.

17. The substrate processing apparatus of claim 1, wherein the holder comprises multiple first labyrinth members, extending in the circumferential direction, arranged at a uniform distance therebetween, and
the heating device comprises multiple second labyrinth members, extending in the circumferential direction, arranged alternately with the multiple first labyrinth members.

18. The substrate processing apparatus of claim 1, further comprising flow paths extending in a vertical direction between neighboring fins adjacent to each other in a circumferential direction of the main body.

19. The substrate processing apparatus of claim 1, wherein the discharge openings are arranged at a regular distance therebetween in a circumferential direction of the main body.

* * * * *